US012775041B2

(12) United States Patent
Chou et al.

(10) Patent No.: US 12,775,041 B2
(45) Date of Patent: Oct. 27, 2026

(54) TIME-DEPENDENT DIELECTRIC BREAKDOWN (TDDB) TEST UNIT, MEASUREMENT CIRCUIT AND METHOD THEREOF

(71) Applicant: TAIWAN SEMICONDUCTOR MANUFACTURING COMPANY LTD., Hsinchu (TW)

(72) Inventors: Kuo-Yu Chou, Hsinchu City (TW); Chi-Hung Lo, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 206 days.

(21) Appl. No.: 18/741,706

(22) Filed: Jun. 12, 2024

(65) Prior Publication Data

US 2025/0383394 A1 Dec. 18, 2025

(51) Int. Cl.
*G01R 31/26* (2020.01)

(52) U.S. Cl.
CPC ..... *G01R 31/2621* (2013.01); *G01R 31/2601* (2013.01)

(58) Field of Classification Search
CPC ........................ G01R 31/2621; G01R 31/2601
See application file for complete search history.

(56) References Cited

U.S. PATENT DOCUMENTS

| | | | | |
|---|---|---|---|---|
| 6,348,806 | B1 * | 2/2002 | Okandan | G01R 31/275<br>324/762.02 |
| 7,212,022 | B2 * | 5/2007 | Suzuki | G01R 31/2856<br>324/762.02 |
| 9,778,313 | B2 * | 10/2017 | Chen | G01R 31/2855 |
| 10,247,770 | B2 * | 4/2019 | Deshpande | H03K 5/159 |
| 10,509,074 | B2 * | 12/2019 | Jan | G01R 31/3185 |

* cited by examiner

*Primary Examiner* — Walter L Lindsay, Jr.
*Assistant Examiner* — Milton Gonzalez
(74) *Attorney, Agent, or Firm* — WPAT LAW; Anthony King

(57) ABSTRACT

A measurement circuit is provided. The measurement circuit includes an array including a plurality of test units arranged in rows and columns. Each test unit includes a device under test, a first control circuit and a second control circuit. The first control circuit is operable in the first power domain corresponding to a first high power supply voltage and a first low power supply voltage and is connected to a first terminal of the device under test. The second control circuit is operable in the second power domain corresponding to a second high power supply voltage and a second low power supply voltage and is connected to a second terminal of the device under test. The first low power supply voltage is equal to or greater than the second high power supply voltage.

20 Claims, 6 Drawing Sheets

TIME-DEPENDENT DIELECTRIC BREAKDOWN (TDDB) TEST UNIT, MEASUREMENT CIRCUIT AND METHOD THEREOF

BACKGROUND

Various tests are performed on the semiconductor devices to assure the reliability of the semiconductor devices. In these tests, a time-dependent dielectric breakdown (TDDB) test is performed to electrically measure and evaluate a breakdown voltage of a dielectric layer of the semiconductor device, and to measure and evaluate the time required for breakdown.

As the integration of semiconductor devices increases and the thickness of dielectric layers (such as gate dielectric layers) decreases, the time required to perform TDDB test increases. Furthermore, the TDDB test is performed on each device formed on the semiconductor substrate in order to check the reliability of the semiconductor devices. As a result, the time required to perform TDDB tests increases.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
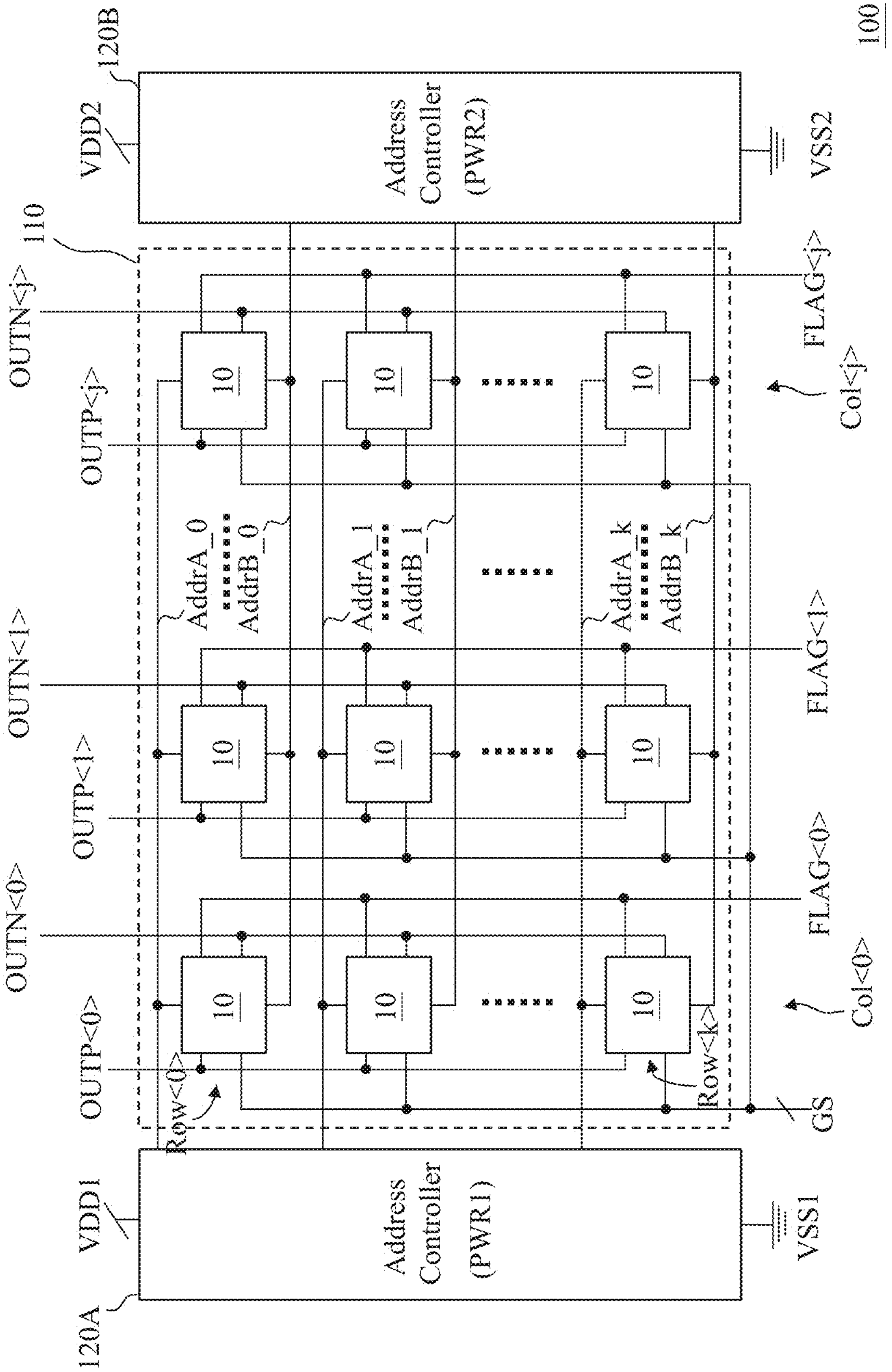
FIG. 1 is a measurement circuit for performing a TDDB test, in accordance with some embodiments of the disclosure.

The following disclosure provides many different embodiments, or examples, for implementing different features of the provided subject matter. Specific examples of components and arrangements are described to simplify the disclosure. These are, of course, merely examples and are not intended to be limiting. For example, the formation of a first feature over or on a second feature in the description that follows may include embodiments in which the first and second features are formed in direct contact, and may also include embodiments in which additional features may be formed therebetween. In addition, the present disclosure may repeat reference numerals and/or letters in the various examples. This repetition is for the purpose of simplicity and clarity and does not in itself dictate a relationship between the various embodiments and/or configurations discussed.

While embodiments of the present disclosure are discussed in detail, it should be appreciated that the present disclosure provides many applicable inventive concepts that can be embodied in a wide variety of specific contexts. The specific embodiments discussed are merely illustrative and do not limit the scope of the disclosure.

Further, spatially relative terms, such as “beneath,” “below,” “lower,” “above,” “upper,” “lower,” “left,” “right” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being “connected to” or “coupled to” another element, it may be directly connected to or coupled to the other element, or intervening elements may be present.

Various circuits in semiconductor wafer are provided in accordance with various exemplary embodiments. Some variations of some embodiments are discussed. Throughout the various views and illustrative embodiments, like reference numbers are used to designate like elements.

According to the embodiments of the present disclosure, a stress voltage is applied on multiple test units of an array for a time-dependent dielectric breakdown (TDDB) test during each global stress operation, thereby decreasing test time. After one or more global stress operations, the rows of the array are read respectively, so as to measure the leakage current of the test units in the same row to find out and flag the leaky test unit in the corresponding row. The subsequent global stress operations are performed on the array, bypassing the flagged leaky test units, thereby improving the accuracy for measuring TDDB.

FIG. 1 is a measurement circuit 100 for performing a TDDB test, in accordance with some embodiments of the disclosure. The measurement circuit 100 is implemented in a semiconductor wafer.

The measurement circuit 100 includes an array 110, an address controller 120A and an address controller 120B. The array 110 includes multiple test units 10 arranged in the rows Row<0> through Row<k> and the columns Col<0> through Col<j>. The address controller 120A is operated in a first power domain PWR1 provided by a high power supply voltage VDD1 and a low power supply voltage VSS1. The address controller 120A is configured to provide the addresses AddrA_0 through AddrA_k to the rows Row<0> through Row<k> of the array 110, respectively. The address controller 120B is operated in a second power domain PWR2 provided by a high power supply voltage VDD2 and a low power supply voltage VSS2. The address controller 120B is configured to provide the addresses AddrB_0 through AddrB_k to the rows Row<0> through Row<k> of the array 110, respectively. The first power domain PWR1 is separate from the second power domain PWR2. In some embodiments, the low power supply voltage VSS1 of the first power domain PWR1 is equal to or greater than the high power supply voltage VDD2 of the second power domain PWR2.

The test units 10 arranged in the same row are addressed by the corresponding address AddrA from the address controller 120A and the corresponding address AddrB from the address controller 120B. For example, the test units 10 arranged in the row Row<0> are selected by the addresses AddrA_0 and AddrB_0, and the test units 10 arranged in the row Row<k> are selected by the addresses AddrA_k and AddrB_k. In some embodiments, each of the address controllers 120A and 120B includes a shift register. In response to a clock signal and a reset signal, the shift register is configured to sequentially assign or enable the addresses AddrA_0 through AddrA_k (or AddrB_0 through AddrB_k).

The test units 10 arranged in the same column are coupled to the same test lines OUTP and OUTN and the same flag line FLAG. For example, the test units 10 arranged in the column Col<0> are coupled to the test line OUTP<0>, the test line OUTN<0> and the one or more flag lines FLAG<0>. In some embodiments, each flag line FLAG is configured to receive a flag signal provided by a testing machine through a pad of the semiconductor wafer during the read operation. In some embodiments, the flag signal FLAG with a high voltage level is used to indicate that the test unit 10 is flagged as a damage unit (or a leaky unit), and the flag signal with a low voltage level is used to indicate that the test unit is a normal unit, i.e., the test unit is not flagged as the damage unit. In some embodiments, each test line OUTP is configured to receive a stress voltage during a global stress operation or a read voltage during a read operation provided by the testing machine through a pad of the semiconductor wafer. In some embodiments, each test line OUTN is configured to provide a measurement current to the test machine through a pad of the semiconductor wafer.

In the array 110, each test unit 10 includes a device under test. Each test unit 10 is coupled to at least two control lines GS. Each control line GS is configured to receive an enable signal for performing the global stress operation on the array 110. In some embodiments, the enable signal of each control line GS is provided by the testing machine through a pad of the semiconductor wafer. During each global stress operation enabled by the control line GS, the stress voltage is applied to the unflagged test units 10 through the test lines OUTP<0> through OUTP<j>, and the unflagged test units 10 are the test units 10 that are not flagged as the damage units by the corresponding flag line FLAG during the previous read operations. Furthermore, during each read operation, the read voltage is applied to the unflagged test units 10 through the test lines OUTP<0> through OUTP<j>, and the current of the device under tests in the unflagged test units 10 are measured through the test lines OUTN<0> through OUTN<j>, so as to determine whether any unflagged test unit need to be flagged by the corresponding flag line FLAG during the current read operation. In some embodiments, each test unit 10 is stressed by the corresponding test lines OUTN and OUTP (e.g., OUTP=1V, OUTN=−1V) at the same time during a stress operation. In some embodiments, each test unit 10 is biased by the corresponding test lines OUTN and OUTP (e.g., OUTP=0.375V, OUTN=−0.375V) at the same time during a read operation. During the read or stress operation, the test machine can sense current of the test unit 10 through the corresponding test line OUTN or OUTP.

By using the measurement circuit 100, a constant stress is applied to each test unit 10 of the array 110. In some embodiments, the constant stress is applied in form of constant voltage stress (CVS) or constant current stress. In some embodiments, the stress voltage is a voltage (that is often lower than a breakdown voltage of an oxide for a transistor) is applied to a gate of the transistor, while its leakage current is being monitored. Furthermore, the time it will take for the oxide to break under the stress voltage constant applied is called the time-to-failure. The TDDB test is repeated several times to obtain a distribution of time-to-failure. These distributions are used to create reliability plots and to predict the TDDB behavior of oxide at other voltages.

Figure 2:
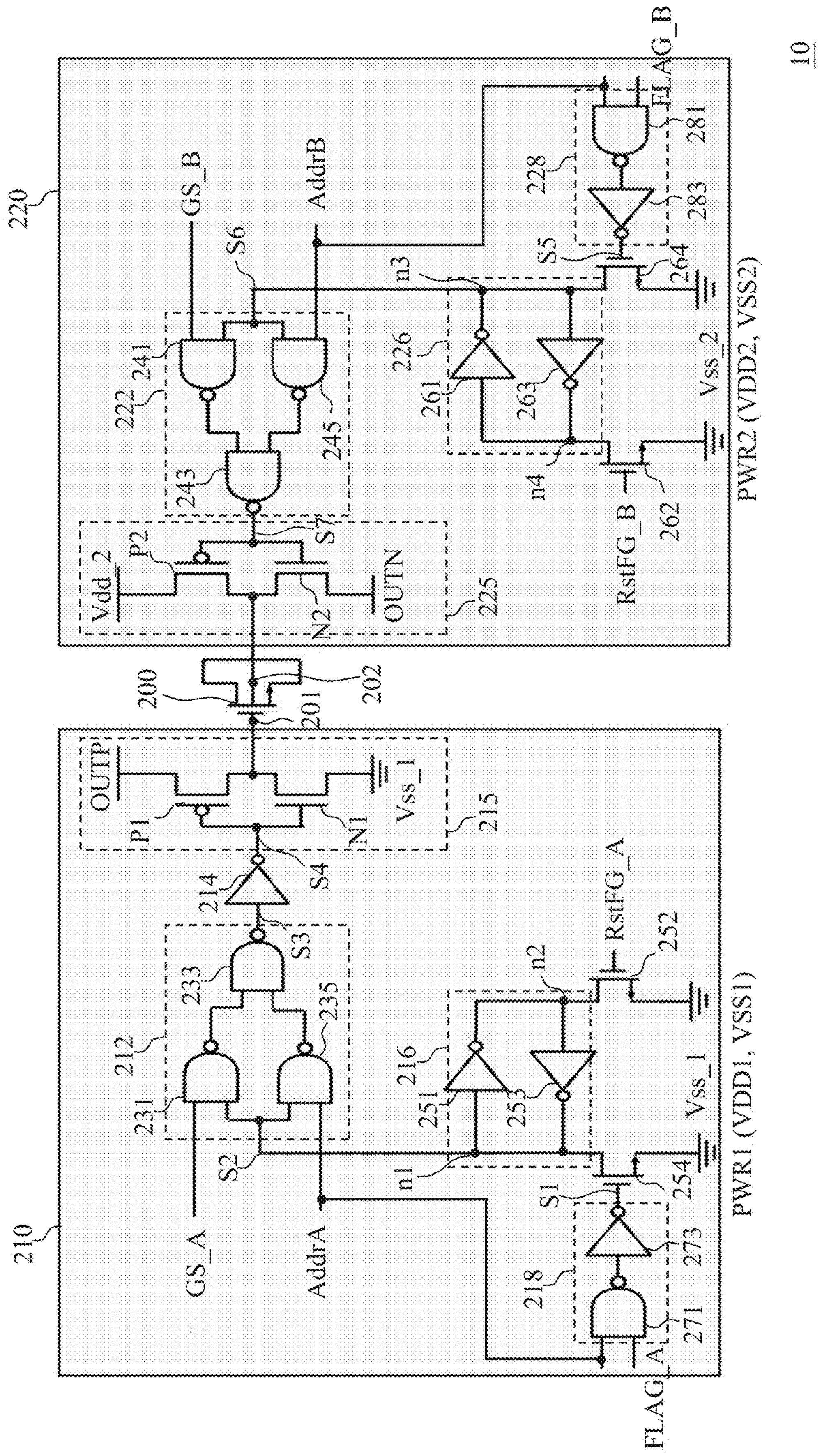
FIG. 2 is a circuit diagram illustrating the test unit of FIG. 1, in accordance with some embodiments of the disclosure.

FIG. 2 is a circuit diagram illustrating the test unit 10 of FIG. 1, in accordance with some embodiments of the disclosure. The test unit 10 includes a device under test (DUT) 200, a first control circuit 210 and a second control circuit 220. The first control circuit 210 and the second control circuit 220 are operated in different power domains. For example, the first control circuit 210 is operated in the first power domain PWR1 corresponding to the high power supply voltage VDD1 and the low power supply voltage VSS1, and the second control circuit 220 is operated in the second power domain PWR2 corresponding to the high power supply voltage VDD2 and the low power supply voltage VSS2.

In some embodiments, the high power supply voltage VDD1 is about between 1.5 through 1.8 volts and the low power supply voltage VSS1 is about 0 in the first power domain PWR1, and the high power supply voltage VDD2 is about 0 and the low power supply voltage VSS2 is about −1.5 through −1.8 volts in the second power domain PWR2. Thus, a maximum difference of the stress voltage applied to the DUT 200 is determined by a voltage difference between the high power supply voltage VDD1 and the low power supply voltage VSS2.

The DUT 200 has a first terminal 201 connected to the first control circuit 210 and a second terminal 202 connected to the second control circuit 220. In the embodiment of FIG. 2, the DUT 200 is an N-type transistor. The first and second terminals of the DUT 200 are the gate and bulk of the N-type transistor, respectively. Furthermore, the source and drain of the N-type transistor are connected to each other.

The first control circuit 210 includes a logic unit 212, an inverter 214, an output inverter 215, a latch 216, a logic unit 218 and the N-type transistors 252 and 254. The logic cells (e.g., the NAND gate and the inverter) of the logic unit 212 and 218, the inverter 214 and the latch 216 are operated in the first power domain PWR1. Furthermore, the signals input to the first control circuit 210 except the output inverter 215 have the voltage levels corresponding to the first power domain PWR1.

The latch 216 includes two inverters 251 and 253 cross-coupled between the nodes n1 and n2. The N-type transistor 252 is coupled between the node n2 and a low power supply line Vss_1 corresponding to the low power supply voltage VSS1. A flag reset signal RstFG_A is applied to a gate of the N-type transistor 252. The N-type transistor 254 is coupled between the node n1 and the low power supply line Vss_1. A gate of the N-type transistor 254 is coupled to an output of the logic unit 218. When a power on reset of the measurement circuit 100 is present, a reset pulse is provided as the flag reset signal RstFG_A, and the N-type transistor 252 is turned on by the flag reset signal RstFG_A with a high voltage level (e.g., the high power supply voltage VDD1). Thus, the node n2 is connected to the low power supply line Vss_1 through the N-type transistor 252, and then a status signal S2 at the node n1 is latched at a high voltage level through the latch 216 when the flag reset signal RstFG_A is changed from a high voltage level (e.g., the high power supply voltage VDD1) to a low voltage level (e.g., the low power supply voltage VSS1).

The logic unit 218 includes a NAND gate 271 and an inverter 273 coupled in serial. The logic unit 218 is configured to provide a signal S1 to the gate of the N-type transistor 254 according to an address signal AddrA from the address controller 120A and a flag signal FLAG_A from the corresponding flag line FLAG. In the embodiment of FIG. 2, the test unit 10 is not flagged as a damage unit when the flag signal FLAG_A having a low voltage level (e.g., the low power supply voltage VSS1), and the test unit 10 is flagged as the damage unit when the flag signal FLAG_A having a high voltage level (e.g., the high power supply voltage VDD1). Furthermore, the test machine is configured to perform a global stress operation and a read operation on the test unit 10, respectively, until the test unit 10 is flagged as the damage unit.

During a read operation, when the test unit 10 is selected by the address signal AddrA (e.g., the address signal AddrA having a high voltage level) and the flag signal FLAG_A has a high voltage level, the test unit 10 is flagged as the damage unit. According to the address signal AddrA having the high voltage level and the flag signal FLAG_A having a high voltage level, the logic unit 218 is configured to provide the signal S1 having a high voltage level (e.g., the high power supply voltage VDD1) to the gate of the N-type transistor 254, so as to turn on the N-type transistor 254. Next, the node n1 is connected to the low power supply line Vss_1 through the N-type transistor 254, and the status signal S2 at the node n1 is latched at a low voltage level (e.g., the low power supply voltage VSS1) through the latch 216 when the flag signal FLAG_A or the address AddrA is changed from a high voltage level (e.g., the high power supply voltage VDD1) to a low voltage level (e.g., the low power supply voltage VSS1).

The logic unit 212 includes 3 NAND gates 231, 233 and 235. The NAND gate 231 is configured to provide an output signal to a first input terminal of the NAND gate 233 according to a global stress signal GS_A from the corresponding control line GS and the status signal S2 latched by the latch 216. The NAND gate 235 is configured to provide an output signal to a second input terminal of the NAND gate 233 according to the address signal AddrA and the status signal S2 latched by the latch 216. Thus, the NAND gate 233 is configured to provide a signal S3 to the inverter 214 according to the received signals. The inverter 214 is configured to invert the signal S3 to produce a signal S4 to the output inverter 215.

The output inverter 215 includes a P-type transistor P1 and an N-type transistor N1. The P-type transistor P1 is coupled between the corresponding test line OUTP and the first terminal 201 of the DUT 200, and the N-type transistor N1 is coupled between the first terminal 201 and the low power supply line Vss_1. In response to the signal S4, the output inverter 215 is configured to couple the first terminal 201 of the DUT 200 to the test line OUTP or the low power supply line Vss_1.

During a global stress operation, the global stress signal GS_A is present (i.e., the global stress signal GS_A has a high voltage level). As described above, the status signal S2 at the node n1 has a high voltage level (e.g., the high power supply voltage VDD1) when the test unit 10 has not be flagged as a damage unit. Thus, the NAND gate 231 is configured to provide a signal having a low voltage level (e.g., the low power supply voltage VSS1) to the NAND gate 233 according to the global stress signal GS_A and the status signal S2 both having a high voltage level (e.g., the high power supply voltage VDD1). After receiving the signal having a low voltage level, the NAND gate 233 is configured to provide the signal S3 having a high voltage level (e.g., the high power supply voltage VDD1) to the inverter 214. Thus, the inverter 214 is configured to provide the signal S4 having a low voltage level (e.g., the low power supply voltage VSS1) to the output inverter 215, so as to turn on the P-type transistor P1. When the P-type transistor P1 is turned on, the stress voltage from the test line OUTP is applied to the first terminal 201 of the DUT 200 through the P-type transistor P1.

During a read operation, the address signal AddrA is present (i.e., the address signal AddrA has a high voltage level). As described above, the status signal S2 at the node n1 has a high voltage level (e.g., the high power supply voltage VDD1) when the test unit 10 has not be flagged as a damage unit. Thus, the NAND gate 235 is configured to provide a signal having a low voltage level (e.g., the low power supply voltage VSS1) to the NAND gate 233 according to the address signal AddrA and the status signal S2 both having a high voltage level (e.g., the high power supply voltage VDD1). After receiving the signal having a low voltage level, the NAND gate 233 is configured to provide the signal S3 having a high voltage level (e.g., the high power supply voltage VDD1) to the inverter 214. Thus, the inverter 214 is configured to provide the signal S4 having a low voltage level (e.g., the low power supply voltage VSS1) to the output inverter 215, so as to turn on the P-type transistor P1. When the P-type transistor P1 is turned on, the read voltage from the test line OUTP is applied to the first terminal 201 of the DUT 200 through the P-type transistor P1. It should be noted that the read voltage of the read operation is less than the stress voltage of the global stress operation.

Similarly, the second control circuit 220 includes a logic unit 222, an output inverter 225, a latch 226, a logic unit 228 and the N-type transistors 262 and 264. The logic cells (e.g., the NAND gate and the inverter) of the logic unit 222 and 228 and the latch 226 are operated in the second power domain PWR2. Furthermore, the signals input to the second control circuit 220 except the output inverter 225 have the voltage levels corresponding to the second power domain PWR2. As described above, the first power domain PWR1 is separated from the second power domain PWR2.

The latch 226 includes two inverters 261 and 263 cross-coupled between the nodes n3 and n4. The N-type transistor 262 is coupled between the node n4 and a low power supply line Vss_2 corresponding to the low power supply voltage VSS2. A flag reset signal RstFG_B is applied to a gate of the N-type transistor 262. The N-type transistor 264 is coupled between the node n3 and the low power supply line Vss_2. A gate of the N-type transistor 264 is coupled to an output of the logic unit 228. When a power on reset of the measurement circuit 100 is present, a reset pulse is provided as the flag reset signal RstFG_B, and the N-type transistor 262 is turned on by the flag reset signal RstFG_B with a high voltage level (e.g., the high power supply voltage VDD2). Thus, the node n4 is connected to the low power supply line Vss_2 through the N-type transistor 262, and then a status signal S6 at the node n3 is latched at a high voltage level through the latch 216 when the flag reset signal RstFG_B is changed from a high voltage level (e.g., the high power supply voltage VDD2) to a low voltage level (e.g., the low power supply voltage VSS2).

The logic unit 228 includes a NAND gate 281 and an inverter 283 coupled in serial. The logic unit 228 is configured to provide a signal S5 to the gate of the N-type transistor 264 according to an address signal AddrB from the address controller 120B and a flag signal FLAG_B from the corresponding flag line FLAG. In the embodiment of FIG. 2, the test unit 10 is not flagged as a damage unit when the flag signal FLAG_B having a low voltage level (e.g., the low power supply voltage VSS2), and the test unit 10 is flagged as the damage unit when the flag signal FLAG_B having a high voltage level (e.g., the high power supply voltage VDD2).

During a read operation, when the test unit 10 is selected by the address signal AddrB (e.g., the address signal AddrB having a high voltage level) and the flag signal FLAG_B has a high voltage level (e.g., the high power supply voltage VDD2), the test unit 10 is flagged as the damage unit. According to the address signal AddrB having the high voltage level and the flag signal FLAG_A having the high voltage level, the logic unit 228 is configured to provide the signal S5 having a high voltage level (e.g., the high power supply voltage VDD2) to the gate of the N-type transistor 264, so as to turn on the N-type transistor 264. Next, the node n3 is connected to the low power supply line Vss_2 through the N-type transistor 264, and the status signal S6 at the node n3 is latched at a low voltage level (e.g., the low power supply voltage VSS2) through the latch 226 when the flag signal FLAG_B or the address AddrB is changed from a high voltage level (e.g., the high power supply voltage VDD2) to a low voltage level (e.g., the low power supply voltage VSS2).

The logic unit 222 includes 3 NAND gates 241, 243 and 245. The NAND gate 241 is configured to provide an output signal to a first input terminal of the NAND gate 243 according to a global stress signal GS_B from the corresponding control line GS and the status signal S6 latched by the latch 226. The NAND gate 245 is configured to provide an output signal to a second input terminal of the NAND gate 243 according to the address signal AddrB and the status signal S6 latched by the latch 226. Thus, the NAND gate 243 is configured to provide a signal S7 to the output inverter 225 according to the received signals.

The output inverter 225 includes a P-type transistor P2 and an N-type transistor N2. The P-type transistor P2 is coupled between a high power supply line Vdd_2 corresponding to the high power supply voltage VDD2 and the second terminal 202 of the DUT 200, and the N-type transistor N2 is coupled between the second terminal 202 and the test line OUTN. In response to the signal S7, the output inverter 225 is configured to couple the second terminal 202 of the DUT 200 to the test line OUTN or the high power supply line Vdd_2.

During a global stress operation, the global stress signal GS_B is present (i.e., the global stress signal GS_B has a high voltage level). As described above, the status signal S6 at the node n3 has a high voltage level (e.g., the high power supply voltage VDD2) when the test unit 10 has not be flagged as a damage unit. Thus, the NAND gate 241 is configured to provide a signal having a low voltage level (e.g., the low power supply voltage VSS2) to the NAND gate 243 according to the global stress signal GS_B and the status signal S6 both having a high voltage level (e.g., the high power supply voltage VDD2). After receiving the signal having a low voltage level, the NAND gate 243 is configured to provide the signal S7 having a high voltage level (e.g., the high power supply voltage VDD2) to the output inverter 225, so as to turn on the N-type transistor N2. When the N-type transistor N2 is turned on, the second terminal 202 of the DUT 200 is connected to the test line OUTN through the N-type transistor N2.

During a read operation, the address signal AddrB is present (i.e., the address signal AddrB has a high voltage level). As described above, the status signal S6 at the node n3 has a high voltage level (e.g., the high power supply voltage VDD2) when the test unit 10 has not be flagged as a damage unit. Thus, the NAND gate 245 is configured to provide a signal having a low voltage level (e.g., the low power supply voltage VSS2) to the NAND gate 243 according to the address signal AddrB and the status signal S6 both having a high voltage level (e.g., the high power supply voltage VDD2). After receiving the signal having a low voltage level, the NAND gate 243 is configured to provide the signal S7 having a high voltage level (e.g., the high power supply voltage VDD2) to the output inverter 225, so as to turn on the N-type transistor N2. When the N-type transistor N2 is turned on, the second terminal 202 of the DUT 200 is connected to the test line OUTN through the N-type transistor N2.

In some embodiments, the test machine is configured to alternately perform a global stress operation and a read operation on the test unit 10 until the test unit 10 is flagged as the damage unit.

Figure 3:
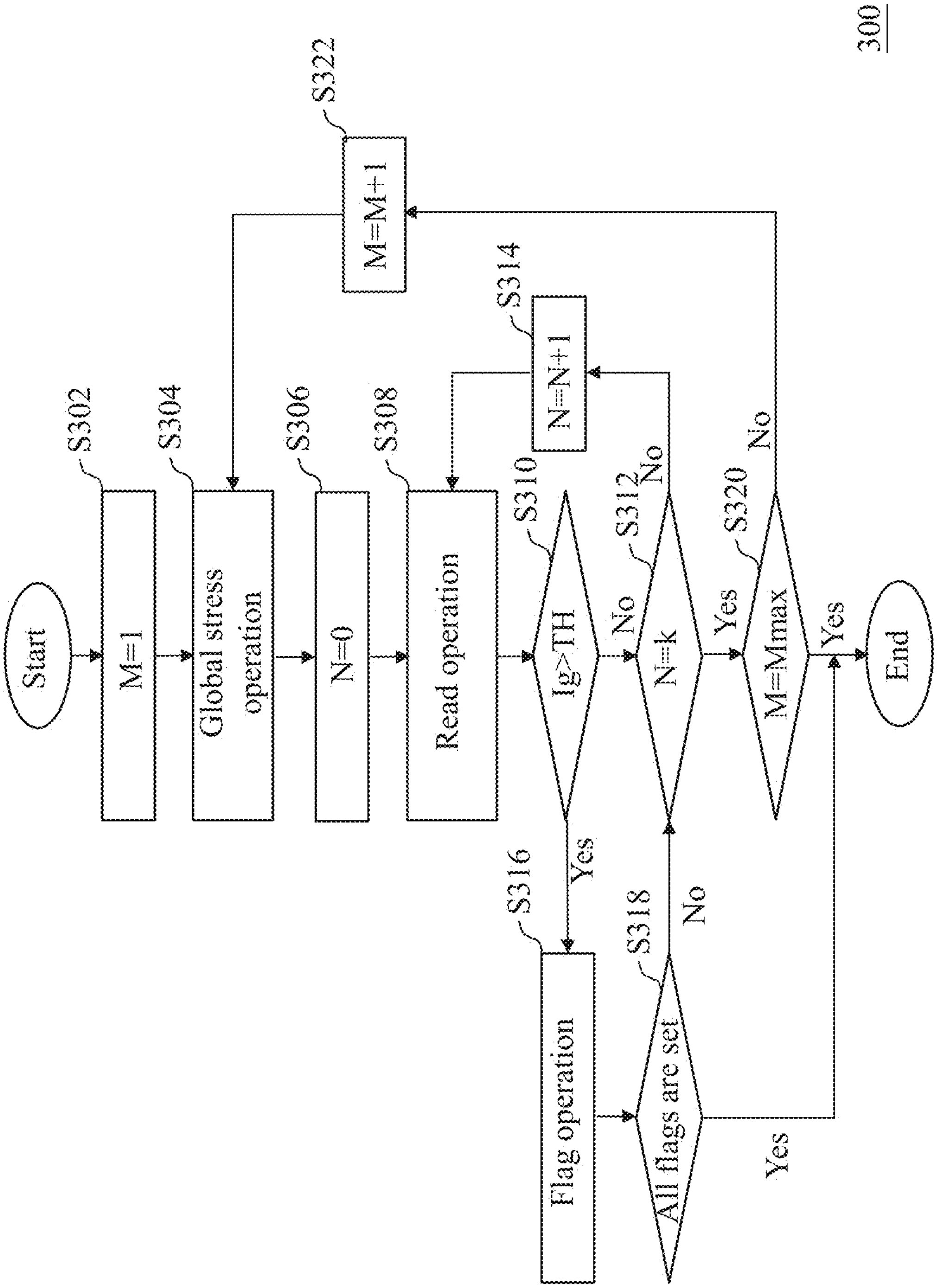
FIG. 3 shows a measurement method for performing a TDDB test in the array formed by the test units of FIG. 2, in accordance with some embodiments of the disclosure.

FIG. 3 shows a measurement method 300 for performing a TDDB test in the array 110 formed by the test units 10 of FIG. 2, in accordance with some embodiments of the disclosure. The measurement method is performed by a test machine (not shown). In some embodiments, the test machine includes a processor (or a controller) and a memory.

Referring to FIG. 2 and FIG. 3, before the flows of the measurement method 300 is performed, a power on reset (POR) of the measurement circuit 100 is present, so as to control the status signals S2 and S6 of each test unit 10 are latched at a high voltage level. For example, in each test unit 10, the status signal S2 at the node n1 is latched at a high voltage level (e.g., the high power supply voltage VDD1) through the latch 216, and the status signal S6 at the node n3 is latched at a high voltage level (e.g., the high power supply voltage VDD2) through the latch 226. In other words, no test unit 10 is flagged as the damage unit in an initial state after the POR. Furthermore, the high voltage level of the status signal S2 is higher than that of the status signal S6.

In operation S302, a parameter M is set to 1 by the processor. In some embodiments, the parameter M represents the number of global stress operations executed at present.

In operation S304, a global stress operation is performed on the array 110. During the global stress operation, the global stress signals GS_A and GS_B of each test unit 10 are set to the corresponding high voltage levels through the corresponding control line GS by the test machine.

In response to the global stress signal GS_A and the status signal S2 both having a high voltage level (e.g., the high power supply voltage VDD1), the logic unit 212 is configured to provide the signal S3 with a high voltage level (e.g., the high power supply voltage VDD1), so that the inverter 214 is configured to invert the signal S3 to produce a signal S4 (e.g., the low power supply voltage VSS1) to turn on the P-type transistor P1 of the output inverter 215. Simultaneously, in response to the global stress signal GS_B and the status signal S6 both having a high voltage level (e.g., the high power supply voltage VDD2), the logic unit 222 is configured to provide the signal S7 with a high voltage level (e.g., the high power supply voltage VDD2) to turn on the N-type transistor N2 of the output inverter 225. Therefore, for the DUT 200, the first terminal 201 is coupled to the test line OUTP and the second terminal 202 is coupled to the test line OUTN. During the global stress operation, the stress voltage from the test machine is applied to the first terminal 201 (i.e., the gate of the transistor under test) and a current from the second terminal 202 (i.e., the bulk of the transistor under test) is flowed to the test machine through the test line OUTN.

In operation S306, a parameter N is set to 0 by the processor after the global stress operation is completed. In some embodiments, the parameter N represents the row Row<N> of the array 110 on which a read operation is to be performed.

In operation S308, a read operation is performed on the row Row<N>, e.g., a read operation is performed on the row Row<0>. During the read operation, the address signals AddrA and AddrB of each test unit 10 in the row Row<N> are selected by the address controllers 120A and 120B.

In response to the address signal AddrA and the status signal S2 both having a high voltage level (e.g., the high power supply voltage VDD1), the logic unit 212 is configured to provide the signal S3 with a high voltage level (e.g., the high power supply voltage VDD1), so that the inverter 214 is configured to invert the signal S3 to produce a signal S4 (e.g., the low power supply voltage VSS1) to turn on the P-type transistor P1 of the output inverter 215. Simultaneously, in response to the address signal AddrB and the status signal S6 both having a high voltage level (e.g., the high power supply voltage VDD2), the logic unit 222 is configured to provide the signal S7 with a high voltage level (e.g., the high power supply voltage VDD2) to turn on the N-type transistor N2 of the output inverter 225. Therefore, for the DUT 200, the first terminal 201 is coupled to the test line OUTP and the second terminal 202 is coupled to the test line OUTN. During the read operation, the read voltage from the test machine is applied to the first terminal 201 and a leakage current Ig between the first terminal 201 (i.e., the gate of the transistor under test) and the second terminal 202 (i.e., the bulk of the transistor under test) is measured by the test machine through the test line OUTN. In some embodiments, the leakage current Ig is monitored by the test line OUTP, the test line OUTN or both at the same time.

In some embodiments, the test machine is configured to measure the leakage current Ig through a test pad of the semiconductor wafer coupled to the test line OUTN. In some embodiments, for the same row of the array 110, the leakage current Ig of the test unit 10 in each column is measured through the respective test line OUTN, e.g., the test lines OUTN<0> through OUTN<j> of FIG. 1.

In operation S310, after measuring the leakage current Ig, it is determined whether the leakage current Ig is greater than a threshold value TH. In some embodiments, the threshold value TH is determined according to specification of the DUT 200. If the leakage current Ig does not exceed the threshold value TH, the measurement method 300 enters operation S312.

In operation S312, it is determined whether the parameter N is equal to k, i.e., it is determined whether the last row row<k> has completed the read operation. If the parameter N is not equal to k, the measurement method 300 enters the operation S314, and the parameter N is update or set to the current value plus 1, i.e., N=N+1.

After updating the parameter N, for example, updating to N=2, the measurement method 300 returns to operation S308, and a read operation is performed on the row correspond to the update parameter N, e.g., the row Row<2>. For example, during the read operation, the read voltage from the test machine is applied to the first terminal 201 and a leakage current Ig between the first terminal 201 (i.e., the gate of the transistor under test) and the second terminal 202 (i.e., the bulk of the transistor under test) is measured by the test machine through the test line OUTN.

In operation S310, after measuring the leakage current Ig, it is determined whether the leakage current Ig is greater than the threshold value TH. If the leakage current Ig exceeds the threshold value TH, the measurement method 300 enters operation S316. During the read operation, the test unit 10 having the leakage current Ig exceeded the threshold value TH can be regarded as a leaky test unit.

In operation S316, a flag operation is performed on the leaky test unit 10 of the current row. The leaky test unit 10 is flagged as a damage unit by providing the flag signal FLAG_A and FLAG_B both with a high voltage level to the leaky test unit 10. Furthermore, the location of the leaky test unit 10 is stored in the memory of the test machine as a flag map.

In response to the address signal AddrA and the flag signal FLAG_A both having a high voltage level (e.g., the high power supply voltage VDD1), the status signal S2 is changed to a low voltage level (e.g., the low power supply voltage VSS1) and latched by the latch 216. In response to the status signal S2 having a low voltage level, the logic unit 212 is configured to provide the signal S3 with a low voltage level (e.g., the low power supply voltage VSS1), so that the inverter 214 is configured to invert the signal S3 to produce a signal S4 (e.g., the high power supply voltage VDD1) to turn on the N-type transistor N1 of the output inverter 215. Simultaneously, in response to the address signal AddrB and the flag signal FLAG_B both having a high voltage level (e.g., the high power supply voltage VDD2), the logic unit 222 is configured to provide the signal S7 with a low voltage level (e.g., the low power supply voltage VSS2) to turn on the P-type transistor P2 of the output inverter 225. Therefore, for the DUT 200, the first terminal 201 is coupled to the low power supply line Vss_1 and separated from the test line OUTP, and the second terminal 202 is coupled to the high power supply line Vdd_2 and separated from the test line OUTN. In other words, the DUT 200 is disconnected to the test lines OUTP and OUTN, and the stress voltage cannot be applied to the DUT 200 during a next global stress operation. Therefore, the DUT 200 will not be further damaged by subsequent global stress operations.

In operation S318, after completing the flag operation, it is determined whether all flags of the test units 10 in the array 110 are set in the flag map of the test machine. If all flags of the test units 10 in the array 110 are set, i.e., there are no unflagged test unit 10 in the array 110, the measurement method 300 is completed. Conversely, if there are still unflagged test units in the array 110, the measurement method 300 enters the operation S312.

In the operation S312, if the parameter N is not equal to k, the measurement method 300 enters the operation S314 and then return to operations S308, so as to perform the read operation of the next row until the parameter N is equal to k (operation S312). If the parameter N is equal to k, the measurement method 300 enters the operation S320.

In operation S320, it is determined whether the parameter M is equal to a maximum value Mmax, and the value Mmax represents the maximum number of the global stress operations to been performed for TDDB test. If the parameter M is equal to the maximum value Mmax, the measurement method 300 is completed. Conversely, if the parameter M is not equal to the maximum value Mmax, the measurement method 300 enters the operation S322, and the parameter M is update or set to the current value plus 1, i.e., M=M+1.

After updating the parameter M, for example, updating to M=2, the measurement method 300 returns to operation S304, and a global stress operation is performed on the array 110 again, and then the following operations are performed until all flags are set (operation S318) or the parameter M is equal to the value Mmax (operation S320), and then the measurement method 300 is completed.

Figure 4:
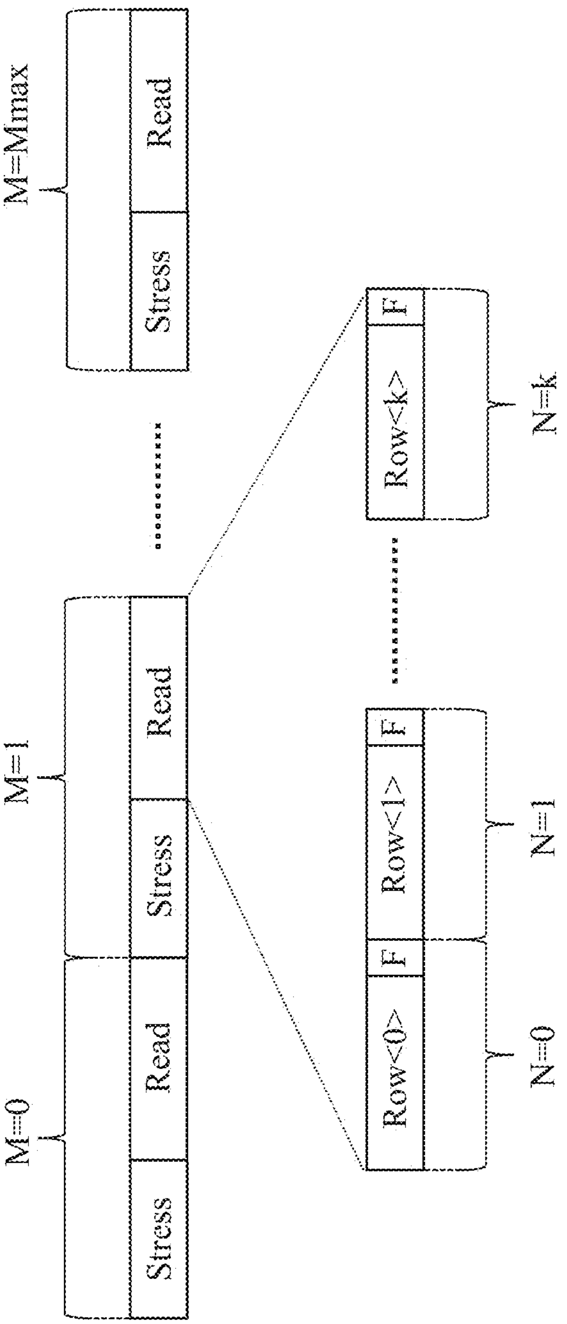
FIG. 4 shows a schematic illustrating timing of the global stress operations and the read operations of the measurement method of FIG. 3, in accordance with some embodiments of the disclosure.

FIG. 4 shows a schematic illustrating timing of the global stress operations and the read operations of the measurement method 300 of FIG. 3, in accordance with some embodiments of the disclosure.

In the embodiment of FIG. 4, the global stress operation (shown as "Stress") and the read operation (shown as "Read") are alternately performed on the test units 10 of the array 110 according to the measurement method 300 of FIG. 3, i.e., the number of the global stress operations performed is equal to the number of the read operations performed. In some embodiments, each read operation is performed after performing multiple consecutive global stress operations, i.e., the number of the global stress operations performed is greater than the number of the read operations performed. In some embodiments, the global stress operations have different stress time. For example, the stress time is set to 1 second when the parameter M is between 0 and 99, and the stress time is set to 5 seconds when the parameter M is between 100 and 199.

In FIG. 4, the parameter M is set to 0 initially (e.g., the operation S302 of FIG. 3), and then the parameter M is gradually increased to the maximum Mmax (e.g., the operation S322 of FIG. 3). During each read operation, the rows Row<0> through Row<k> of the array 110 are read in sequence, and a corresponding flag operation (shown as "F", such as the operation S316 of FIG. 3) is performed after each row is read.

As described above, a stress voltage having a higher voltage value (e.g., 1.5 volts) is applied on the test unit 10 during each global stress operation, and a read voltage having a lower voltage value (e.g., 0.8 volts) is applied on the test unit 10 during each read operation. In some embodiments, the DUTs 200 of the test units 10 arranged in the same row or same column have the same size or different sizes. In some embodiments, the test units 10 arranged in different columns/rows are applied by individual stress voltages with the same or different voltage values. In some embodiments, the test units 10 arranged in different columns/rows are applied by individual read voltages with the same or different voltage values.

According to the measurement method 300 and the measurement circuit 100, multiple DUT 200 of the array 110 are tested simultaneously, i.e., a stress time of the global stress operation share with all of the rows of the array 110. Therefore, compared with only measure single DUT at one time, a global stress operation of the measurement method 300 reduces the measurement time, thereby increasing throughput and pattern density for TDDB test.

Figure 5:
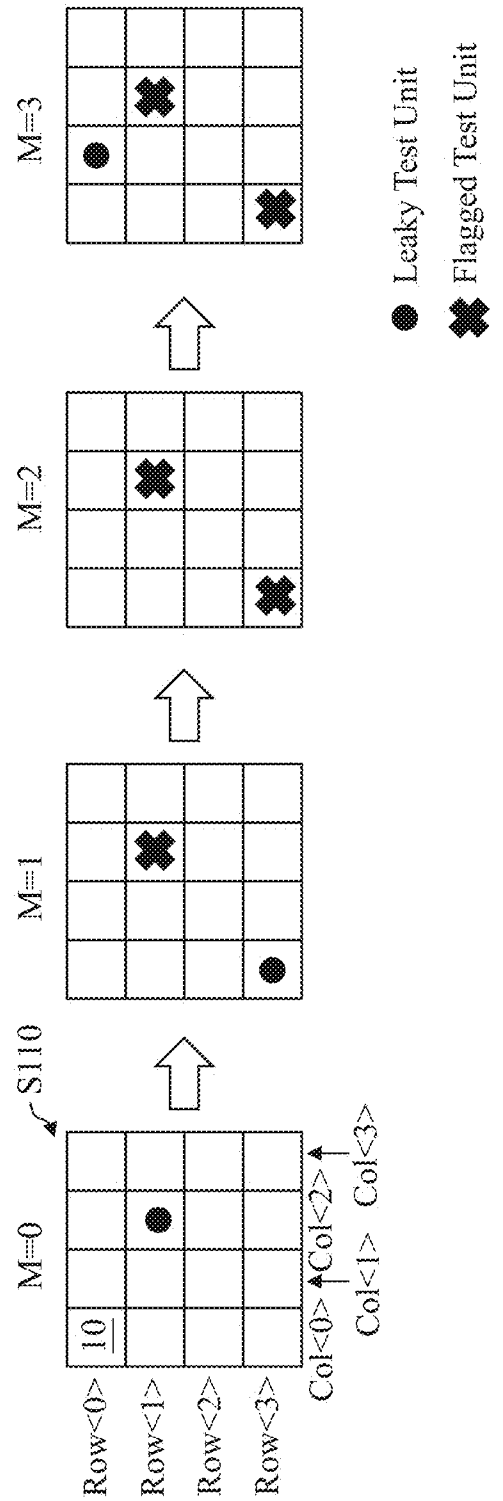
FIG. 5 shows a schematic illustrating an operation process of the measurement method of FIG. 3, in accordance with some embodiments of the disclosure.

FIG. 5 shows a schematic illustrating an operation process of the measurement method 300 of FIG. 3, in accordance with some embodiments of the disclosure. In FIG. 5, the array 110 includes the test units 10 arranged in the rows Row<0> through Row<3> and the columns Col<0> through Col<3>.

First, the parameter M is set to 0, and a first global stress operation is performed on all test units 10 in the array 110. During a read operation in the row Row<1>, the test unit 10 in the column Col<2> has a leakage circuit Ig greater than the threshold value TH, i.e., the test unit 10 is a leaky test unit. Thus, the leaky test unit is flagged as a first flagged test unit by the test machine.

Next, the parameter M is set to 1, and a second global stress operation is performed on the test units 10 of the array 110 other than the first flagged test unit. During a read operation in the row Row<3>, the test unit 10 in the column Col<0> has a leakage circuit Ig greater than the threshold value TH, i.e., the test unit 10 is a leaky test unit. Thus, the leaky test unit is flagged as a second flagged test unit by the test machine.

Next, the parameter M is set to 2, and a third global stress operation is performed on the test units 10 of the array 110 other than the first and second flagged test units. During each read operation in the rows, no test unit 10 has a leakage circuit Ig greater than the threshold value TH, i.e., no leaky test unit is present.

Next, the parameter M is set to 3, and a fourth global stress operation is performed on the test units 10 of the array 110 other than the first and second flagged test units. During a read operation in the row Row<0>, the test unit 10 in the column Col<1> has a leakage circuit Ig greater than the threshold value TH, i.e., the test unit 10 is a leaky test unit. Thus, the leaky test unit is flagged as a third flagged test unit by the test machine.

The measurement method 300 continues to be performed until all test unit 10 are flagged or the number of global stress operations has reached the maximum value Mmax. The defect DUT 200 in the test unit 10 becomes leaky during the global stress operations. As time goes, more and more leaky test units 10 are present. By isolating the leaky test unit through the flag operation, no accumulated leakage current will induce a large voltage drop for the stress voltage, thus the stress voltage can keep substantially constant.

Figure 6:
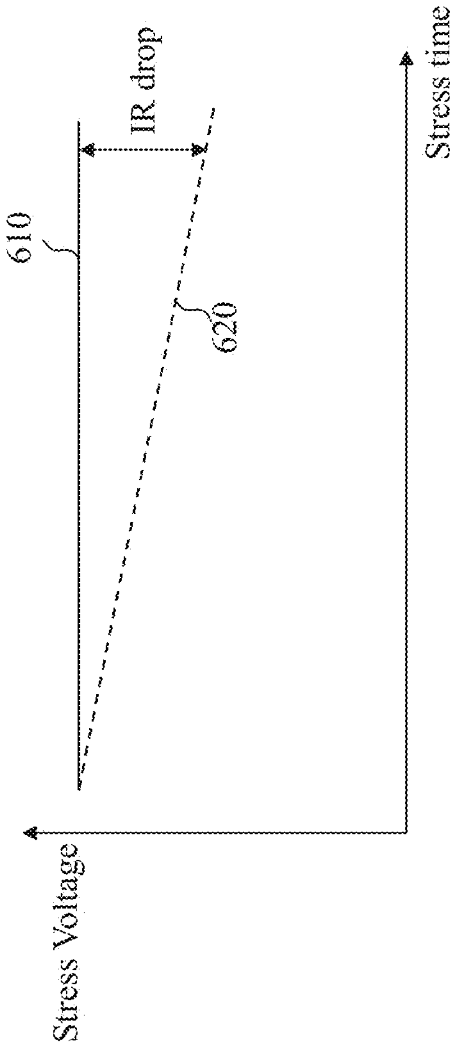
FIG. 6 shows a diagram illustrating the relationship between the stress voltage and the stress time, in accordance with some embodiments of the disclosure.

FIG. 6 shows a diagram illustrating the relationship between the stress voltage and the stress time, in accordance with some embodiments of the disclosure. The label 610 represents the stress voltage applied at the first terminal 201 of the DUT 200 when the leaky test units of the array 110 are isolated by the flag operation, and the label 620 represents the stress voltage applied at the first terminal 201 of the DUT 200 when the leaky test units of the array 110 are not isolated. When the leaky test units of the array 110 are not isolated, the leakage current of each leaky test unit is increased with the time of stress operation. As leakage current increases, the parasitic impedance of the test path from the test machine to the array 110 results in a larger IR drop for the stress voltage. Therefore, the stress voltage applied to the DUT 200 is not as expected, resulting in inaccurate test results.

By performing the global stress operation, a stress voltage is applied on the test units 10 of the array 110 at the same time, thus decreasing test time for measuring TDDB. Furthermore, by performing the flag operation, the leaky test unit is isolated from the subsequent global stress operations, thereby improving the accuracy for measuring TDDB.

According to some embodiments, a measurement circuit for time-dependent dielectric breakdown (TDDB) test is provided. The measurement circuit includes an array including a plurality of test units arranged in rows and columns, a first address controller operable in the first power domain and configured to provide a plurality of first row addresses to the test units of the array, and a second address controller operable in the second power domain and configured to provide a plurality of second row addresses to the test units of the array. Each of the test units includes a device under test, a first control circuit and a second control circuit. The first control circuit is operable in a first power domain corresponding to a first high power supply voltage and a first low power supply voltage, and is connected to a first terminal of the device under test. The second control circuit is operable in a second power domain corresponding to a second high power supply voltage and a second low power supply voltage and is connected to a second terminal of the device under test. The first low power supply voltage is equal to or greater than the second high power supply voltage.

According to some embodiments, a test unit is provided. The test unit includes a device under test, a first control circuit operable in a first power domain corresponding to a first high power supply voltage and a first low power supply voltage, and a second control circuit operable in a second power domain corresponding to a second high power supply voltage and a second low power supply voltage. The first control circuit includes a first output inverter. The first output inverter includes a first P-type transistor coupled between a first test line and a first terminal of the device under test, and a first N-type transistor coupled between the first terminal of the device under test and a low power supply line corresponding to the first low power supply voltage. The second control circuit includes a second output inverter. The second output inverter includes a second P-type transistor coupled between a high power supply line corresponding to the second high power supply voltage and a second terminal of the device under test, and a second N-type transistor coupled between the second terminal of the device under test and a second test line. A stress voltage is applied to the first test line during a stress operation, and a read voltage is applied to the first test line during a read operation. The stress voltage is greater than the read voltage.

According to some embodiments, a method for measuring time-dependent dielectric breakdown (TDDB). A global stress operation is performed on an array formed by a plurality of test units arranged in a plurality of rows and a plurality of columns. A read operation is sequentially performed on each of the rows of the array after the global stress operation is performed, to obtain a leakage current of each of the test units in the same row. The test unit having the leakage current that is greater than a threshold value is flagged. A next global stress operation is performed on the test units of the array other than the flagged test unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A measurement circuit for time-dependent dielectric breakdown (TDDB) test, comprising:
- an array comprising a plurality of test units arranged in rows and columns, wherein each of the test units comprises:
  - a device under test;
  - a first control circuit operable in a first power domain corresponding to a first high power supply voltage and a first low power supply voltage, and connected to a first terminal of the device under test; and
  - a second control circuit operable in a second power domain corresponding to a second high power supply voltage and a second low power supply voltage, and connected to a second terminal of the device under test; and
- a first address controller operable in the first power domain, and configured to provide a plurality of first row addresses to the test units of the array; and
- a second address controller operable in the second power domain, and configured to provide a plurality of second row addresses to the test units of the array,
- wherein the first low power supply voltage is equal to or greater than the second high power supply voltage.

2. The measurement circuit of claim 1, wherein the device under test is an N-type transistor, and the first and second terminals of the device under test are gate and bulk of the N-type transistor.

3. The measurement circuit of claim 2, wherein drain and source of the N-type transistor are connected to each other.

4. The measurement circuit of claim 1, wherein each of the first and second control circuits comprises a latch configured to latch a status signal which indicates whether the test unit is flagged as a damage unit.

5. The measurement circuit of claim 4, wherein in each of the test units that is not flagged as the damage unit, the first control circuit is configured to connect the first terminal of the device under test to a first test line of a test machine, and the second control circuit is configured to connect the second terminal of the device under test to a second test line of the test machine.

6. The measurement circuit of claim 5, wherein in each of the test units that is flagged as the damage unit, the first control circuit is configured to separate the first terminal of the device under test from the first test line, and the second control circuit is configured to separate the second terminal of the device under test from the second test line.

7. The measurement circuit of claim 5, wherein during a global stress operation, a stress voltage from the test machine is applied to the first terminal of the device under test of each of the test units that is not flagged as the damage unit through the first test line.

8. The measurement circuit of claim 7, wherein during a read operation, a read voltage from the test machine is applied to the first terminal of the device under test of each of the test units that is not flagged as the damage unit and is selected by the first and second row addresses.

9. The measurement circuit of claim 8, wherein the stress voltage is greater than the read voltage.

10. The measurement circuit of claim 8, wherein in each of the test units that is not flagged as the damage unit and is selected by the first and second row addresses, a leakage current from the second terminal of the device under test is measurable by the test machine through the second test line.

11. A measurement circuit for time-dependent dielectric breakdown (TDDB) test, comprising:
- an array comprising a plurality of test units arranged in rows and columns, wherein each of the test units comprises:
  - a device under test;
  - a first control circuit operable in a first power domain corresponding to a first high power supply voltage and a first low power supply voltage, and configured to couple a first terminal of the device under test to a first test line or a low power supply line corresponding to the first low power supply voltage; and
  - a second control circuit operable in a second power domain corresponding to a second high power supply voltage and a second low power supply voltage, and configured to couple a second terminal of the device under test to a second test line or a high power supply line corresponding to the second high power supply voltage, wherein each of the first and second control circuits comprises a latch configured to latch a status signal which indicates whether the test unit is flagged as a damage unit; and a first address controller operable in the first power domain, and configured to provide a plurality of first row addresses to the test units of the array; and a second address controller operable in the second power domain, and configured to provide a plurality of second row addresses to the test units of the array.

12. The measurement circuit of claim 11, wherein the first power domain is separate from the second power domain.

13. The measurement circuit of claim 11, wherein in each of the test units that is not flagged as the damage unit, the first control circuit is configured to connect the first terminal of the device under test to the first test line, and the second control circuit is configured to connect the second terminal of the device under test to the second test line.

14. The measurement circuit of claim 11, wherein in each of the test units that is flagged as the damage unit, the first control circuit is configured to couple the first terminal of the device under test to the low power supply line, and the second control circuit is configured to couple the second terminal of the device under test to the high power supply line.

15. The measurement circuit of claim 11, wherein during a global stress operation, a stress voltage from the first test line is applied to the first terminal of the device under test of each of the test units that is not flagged as the damage unit, and during a read operation, a read voltage from the first test line is applied to the first terminal of the device under test of each of the test units that is not flagged as the damage unit and is selected by the first and second row addresses, wherein the stress voltage is greater than the read voltage.

16. The measurement circuit of claim 11, wherein in each of the test units that is not flagged as the damage unit and is selected by the first and second row addresses, a leakage current from the second terminal of the device under test is measurable through the second test line.

17. A measurement circuit for time-dependent dielectric breakdown (TDDB) test, comprising:

an array comprising a plurality of test units arranged in rows and columns, wherein each of the test units comprises:

a device under test;

a first control circuit operable in a first power domain corresponding to a first high power supply voltage and a first low power supply voltage, and comprising:

a first output inverter, comprising:

a first P-type transistor coupled between a first test line and a first terminal of the device under test; and a first N-type transistor coupled between the first terminal of the device under test and a low power supply line corresponding to the first low power supply voltage; and a second control circuit operable in a second power domain corresponding to a second high power supply voltage and a second low power supply voltage, and comprising:

a second output inverter, comprising:

a second P-type transistor coupled between a high power supply line corresponding to the second high power supply voltage and a second terminal of the device under test; and a second N-type transistor coupled between the second terminal of the device under test and a second test line, wherein a stress voltage is applied to the first test line during a stress operation, and a read voltage is applied to the first test line during a read operation, wherein the stress voltage is greater than the read voltage.

18. The measurement circuit of claim 17, wherein in the test unit, each of the first and second control circuits comprises a latch configured to latch a status signal which indicates whether the test unit is flagged as a damage unit.

19. The measurement circuit of claim 18, wherein in each of the test units that is not flagged as the damage unit, the first control circuit is configured to turn on the first P-type transistor and turn off the first N-type transistor, and the second control circuit is configured to turn off the second P-type transistor and turn on the second N-type transistor.

20. The measurement circuit of claim 18, wherein in each of the test units that is flagged as the damage unit, the first control circuit is configured to turn off the first P-type transistor and turn on the first N-type transistor, and the second control circuit is configured to turn on the second P-type transistor and turn off the second N-type transistor.

* * * * *